(12) United States Patent
Frankowsky

(10) Patent No.: US 6,937,531 B2
(45) Date of Patent: Aug. 30, 2005

(54) MEMORY DEVICE AND METHOD OF STORING FAIL ADDRESSES OF A MEMORY CELL

(75) Inventor: Gerd Frankowsky, Höhenkirchen-Siegertsbrunn (DE)

(73) Assignee: Infineon Technologies AG, Munich (DE)

( * ) Notice: Subject to any disclaimer, the term of this patent is extended or adjusted under 35 U.S.C. 154(b) by 26 days.

(21) Appl. No.: 10/624,031

(22) Filed: Jul. 21, 2003

(65) Prior Publication Data

US 2005/0018497 A1 Jan. 27, 2005

(51) Int. Cl.⁷ .............................................. G11C 29/00
(52) U.S. Cl. .................... 365/200; 365/201; 365/189.05
(58) Field of Search ................................. 365/200, 201, 365/189.05, 189.07, 189.01

(56) References Cited

U.S. PATENT DOCUMENTS

| | | | | |
|---|---|---|---|---|
| 4,414,665 A | * | 11/1983 | Kimura et al. | 714/719 |
| 5,862,088 A | * | 1/1999 | Takemoto et al. | 365/201 |
| 5,946,250 A | * | 8/1999 | Suzuki | 365/201 |
| 6,072,737 A | * | 6/2000 | Morgan et al. | 365/201 |
| 6,539,506 B1 | | 3/2003 | Lammers et al. | 714/719 |
| 6,829,181 B1 | * | 12/2004 | Seitoh | 365/201 |
| 2001/0052093 A1 | * | 12/2001 | Oshima et al. | 714/719 |
| 2003/0005353 A1 | | 1/2003 | Mullins et al. | 714/5 |
| 2003/0033561 A1 | * | 2/2003 | Oonk | 714/42 |

FOREIGN PATENT DOCUMENTS

EP  1 008 993 A2  6/2000  ........... G11C/29/00

OTHER PUBLICATIONS

Tarr, M. et al., "Defect Analysis System Speeds Test and Repair of Redundant Memories," Electronics, VNU Business Publications, vol. 57, No. 1, Jan. 12, 1984, pp. 175–179.
International Search Report for counterpart international patent application number PCT/EP2004/07740, dated Nov. 9, 2004, 7 pages.

* cited by examiner

Primary Examiner—Van Thu Nguyen
Assistant Examiner—Dang Nguyen
(74) Attorney, Agent, or Firm—Brinks Hofer Gilson & Lione

(57) ABSTRACT

The embodiments of the present invention are directed to a self-repair schema for memory chips, using a sortable fail-count/fail-address register. The embodiments of the present invention utilize the available redundancy efficiently by scanning the memory array to locate the n elements (WLs or CSLs) with the highest number of defects. A circuit preferably comprises one or more comparators to compare a fail count of an address in an input register with at least one fail count stored in the sortable fail-count/fail-address register. The embodiments of the present invention can be used for an on-chip redundancy calculation and can handle a two dimensional (i.e. row and column) redundancy.

29 Claims, 5 Drawing Sheets

MEMORY DEVICE AND METHOD OF STORING FAIL ADDRESSES OF A MEMORY CELL

FIELD OF THE INVENTION

The present invention relates generally to memory devices, and in particular, to a memory device and method of storing fail addresses of a memory cell.

BACKGROUND OF THE INVENTION

Memory tests on semiconductor devices, such as random access memory devices, are typically performed by the manufacturer during fabrication to locate defects and failures in the devices that can occur during the fabrication of the device. This testing is typically performed by a processor which runs a testing program before the die containing the semiconductor device is packaged into a chip. Many semiconductor devices including memory devices typically have redundant circuitry to replace malfunctioning circuitry found during testing. By enabling the redundant circuitry, the device need not be discarded even if some of the circuits are defective.

As memory size increases, the time required to test a DRAM being manufactured must increase as well, resulting in additional cost. Also, as DRAM applications grow and processors begin to incorporate large quantities of memory on chip, it is necessary to create new testing schemes for these embedded memories. When there is no direct connection between pins and memory, external testing can be difficult. That is, ensuring that every bit is tested thoroughly requires complex test vectors.

Built in self testing (BIST) Built in self testing enables cheaper testing equipment to be used to test the memory device, as well as parallel testing which can increase chip production rates. Finally, built in self tests can, in some cases, be performed throughout the operational life of the chip. However, conventional methods for determining defects in a semiconductor device are complex and can be time consuming.

Accordingly, there is a need for a memory device and method of determining defects in a semiconductor device by scanning the memory array to locate the word lines and column select lines with the highest number of defects and by storing fail addresses of a memory cell.

BRIEF SUMMARY OF THE INVENTION

The embodiments of the present invention are directed to a self-repair schema for memory chips using a sortable fail-count/fail-address register. The embodiments of the present invention utilize the available redundancy efficiently by scanning the memory array to locate the n elements (WLs or CSLs) with the highest number of defects. A circuit preferably comprises one or more comparators to compare a fail count of an address in an input register with at least one fail count stored in the sortable fail-count/fail-address register. The embodiments of the present invention can be used for an on-chip redundancy calculation and can handle a two dimensional (i.e. row and column) redundancy.

DETAILED DESCRIPTION OF THE DRAWINGS

Figure 1:
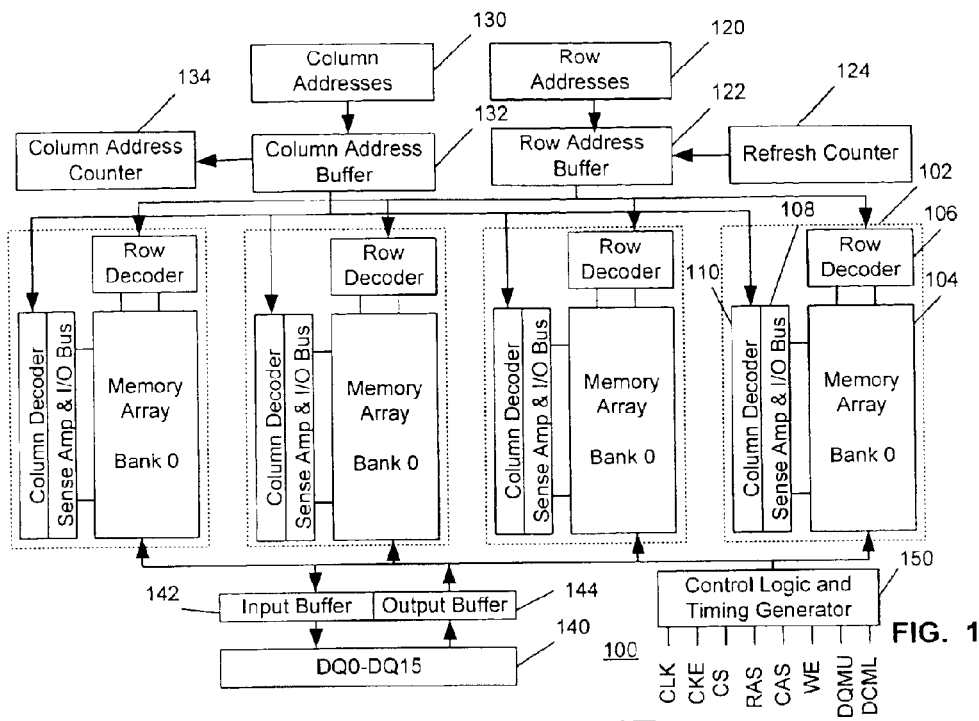
FIG. 1 is a block diagram of memory employing the embodiments of the present invention.

Turning first to FIG. 1, a block diagram of memory device such as a dynamic random access memory (DRAM) employing the embodiments of the present invention is shown. In particular, a memory device 100 comprises a plurality of arrays 102, each of which comprises a memory array bank 104, a row decoder 106, a sense amp and input/output bus 108, and a column decoder 110. The memory device 100 further comprises a row address register 120 coupled to a row address buffer 122, which receives a signal from a refresh counter 124. Similarly, a column address register 130 is coupled to a column address buffer 132 which provides an output to a column address counter 134. A data input/output block 140 is coupled to an input buffer 142 and an output buffer 144. The input buffer 142 and the output buffer 144 enable the transfer of data to and from the various arrays. Finally, a control logic and timing generator block 150 receives control signals, which are well known in the art, for reading or writing data to the memory device.

Figure 2:
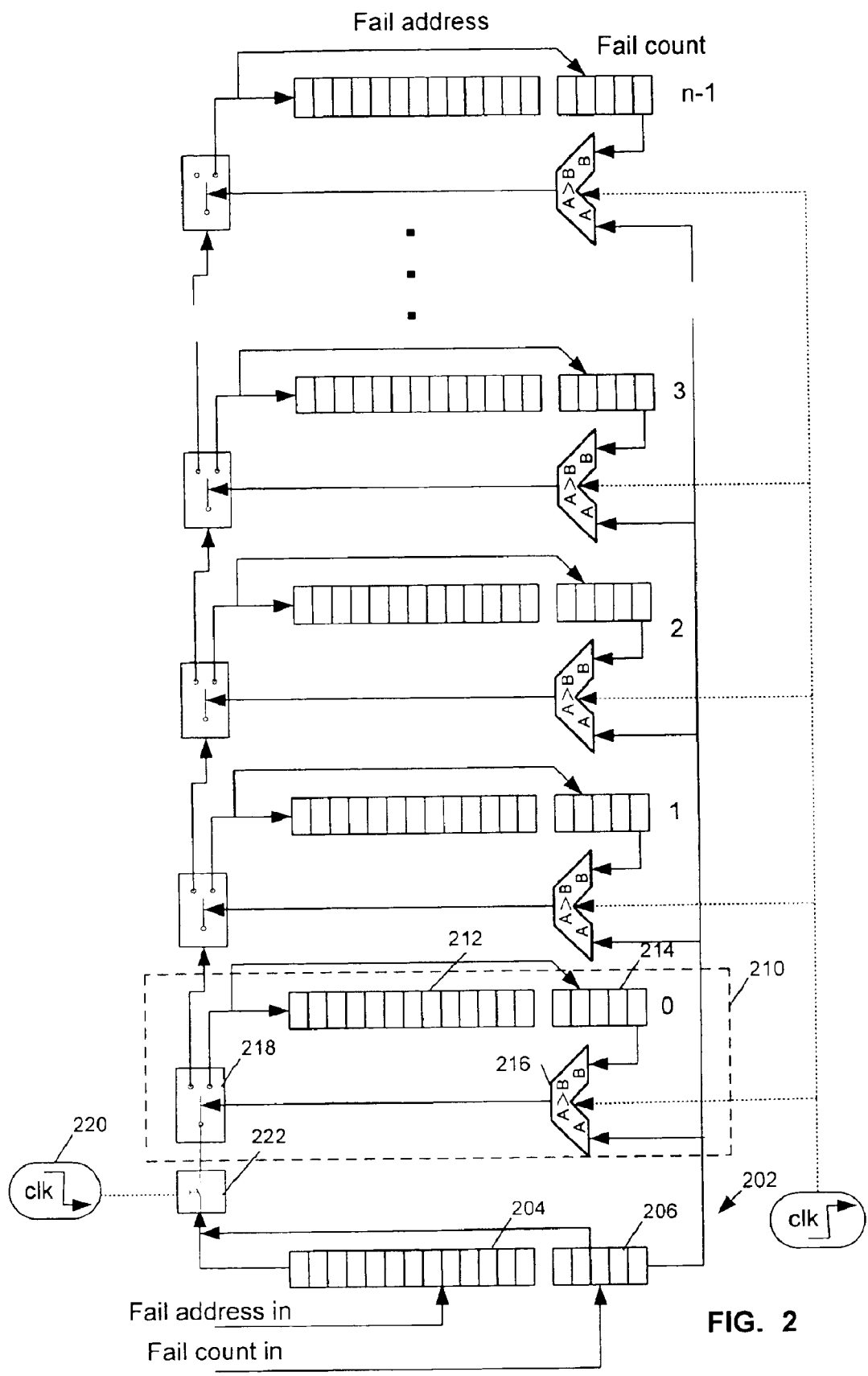
FIG. 2 is a block diagram of a circuit for storing failure addresses of a memory cell according to the present invention.

Turning now to FIG. 2, a block diagram of a circuit for storing failure addresses of a memory cell according to the present invention is shown. The stack of FIG. 2 contains n registers, and could be implemented, for example, in the control logic and timing generator block 150. Each register is divided into two parts, one to store the fail bit address and the other to store the fail-count. The bits containing fail count information of each register are further connected to a comparator. A stack with a depth of n registers therefore requires n comparators.

In particular, circuit 200 comprises an input register 202 having a fail address input portion 204 and a fail count portion 206. The circuit 200 also comprises a plurality of registers 210. Each register 210 comprises a fail address portion 212 and a fail count portion 214. A comparator 216 receives the fail count portion 214 and fail count portion 206 of the input register 202. A switch 218, which is controlled by the output of the comparator 216, enables the transfer of a fail address and a failed count to the input register 202. Finally, a clock signal 220 is coupled to a switch 222, enabling the transfer of data on the falling edge of the clock signal. The clock signal is also coupled to the input of the comparator 216 to enable the comparison on the rising edge of the clock signal. As can be seen in the circuit, the comparator is enabled on the rising of the clock signal, generating an output which is coupled to the switch 218. The state of the switch 18 determines whether the fail address and the fail count are transferred from the input register to one of the registers 210. The operation of the circuit will be described in more detail in reference to the flowchart of FIG. 7.

One advantage of the implementation of FIG. 2 is the speed in determining defects in the semiconductor device. The new fail-count can be simultaneously compared to all fail-counts stored on the register at the rising clock edge. Depending on the compare results, the new fail-address and fail-count can be transferred to the stack at the falling clock edge. Therefore adding a new element to the stack can be done within one clock cycle. The drawback of the solution of FIG. 2 is the required chip area, because each stack element requires a comparator.

Figure 3:
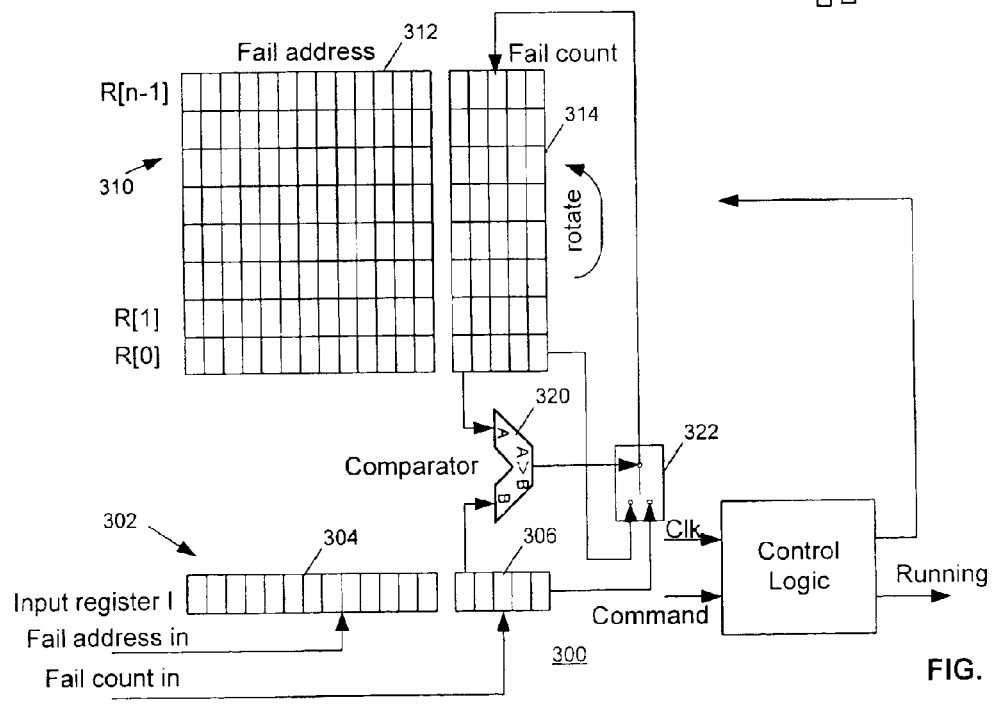
FIG. 3 is a block diagram of a circuit for storing failure addresses of a memory cell according to an alternate embodiment of the present invention.

Turning now to FIG. 3, a block diagram of a circuit for storing failure addresses of a memory cell according to an alternate embodiment of the present invention is shown. Because the embodiment of FIG. 3 comprises only one comparator, the fail count in the input register is only compared against the fail count stored in register R[0]. The register stack can be rotated so that the input fail count can be compared to the fail counts stored in all registers. Two rotate operations are possible. The first rotate would be based upon fail address stored in the register stack only, while a second rotate would be based upon the register stack and the input register.

In particular, a circuit 300 comprises an input register 302 having an input fail address 304 and an input fail count 306. The circuit 300 comprises a register stack 310 having a plurality of fail address registers 312 and fail count registers 314. A comparator 320 compares a fail count of register R[0] with the input fail count 306. Finally, a switch 322 enables the transfer of the input fail address 304 and the corresponding input fail count 306 into the register R[n−1]. One advantage of the circuit of FIG. 3 is that the required area for this circuit is smaller compared to FIG. 4 because only one comparator is required. However, adding a new element to the stack takes longer. As be described in more detail in reference to FIG. 4, n+1 clock cycles are required to add a new element for a stack with a depth of n elements.

Figure 4:
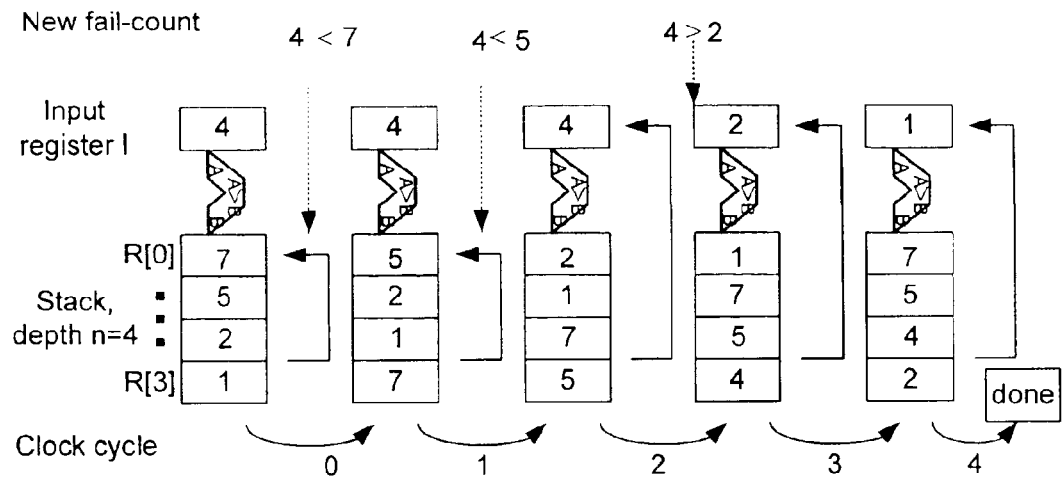
FIG. 4 is a diagram showing the operation of the circuit of FIG. 3.

Turning now to FIG. 4, a diagram shows the operation of the circuit of FIG. 3 for a register stack having a depth of 4 registers. At the beginning of the operation, the new fail count is stored in the input register (I). As long as the new fail count is lower than the fail count stored in the Register R[0], a 'stack-only' rotation is performed, as shown for example in clock cycles 0 and 1. That is, the fail address and fail count stored in register R[0] are shifted to the register R[n−1], while the fail addresses and the fail counts stored in the other registers are shifted down as shown. However, once the comparator detects a lower fail count on the stack, the rotation-mode is changed. In particular, a rotation of both the input register and the registers in the stack is performed. The operation ends after n+1 clock-cycles. At that point, the register stack having the lowest fail count is in the input register, where it will be overwritten at the beginning of the next stack-operation.

Figure 5:
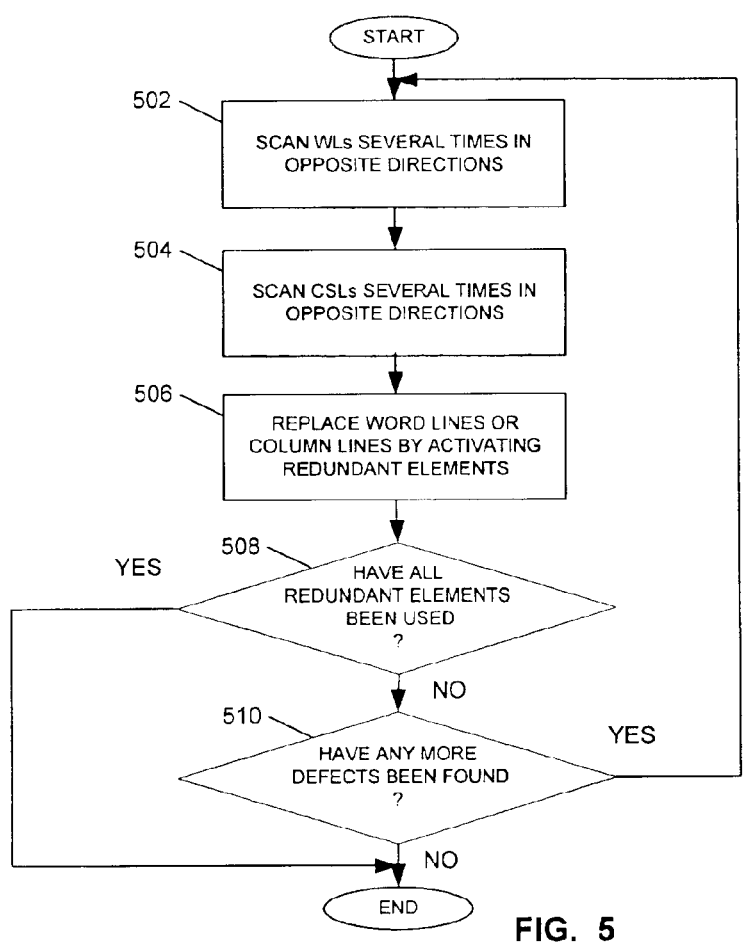
FIG. 5 is a flow chart showing a method of scanning word lines and column select lines according to an embodiment of the present invention.

Turning now to FIG. 5, a flow chart shows a method of scanning word lines and column select lines according to an embodiment of the present invention. In particular, word lines are scanned several times in opposite directions at a step 502. An example of a method of scanning the word lines is described in more detail in reference to FIG. 6. The column select lines are also scanned several times in opposite directions at a step 504. It will be understood that the column select lines could be scanned according to the method of FIG. 6 as applied to columns rather than rows.

Word lines or column lines are then replaces with redundant elements at a step 506. It is then determined whether all redundant elements have been used at a step 508. If so, the process is ended. If not, it is then determined whether any more defects are found at a step 510.

Figure 6:
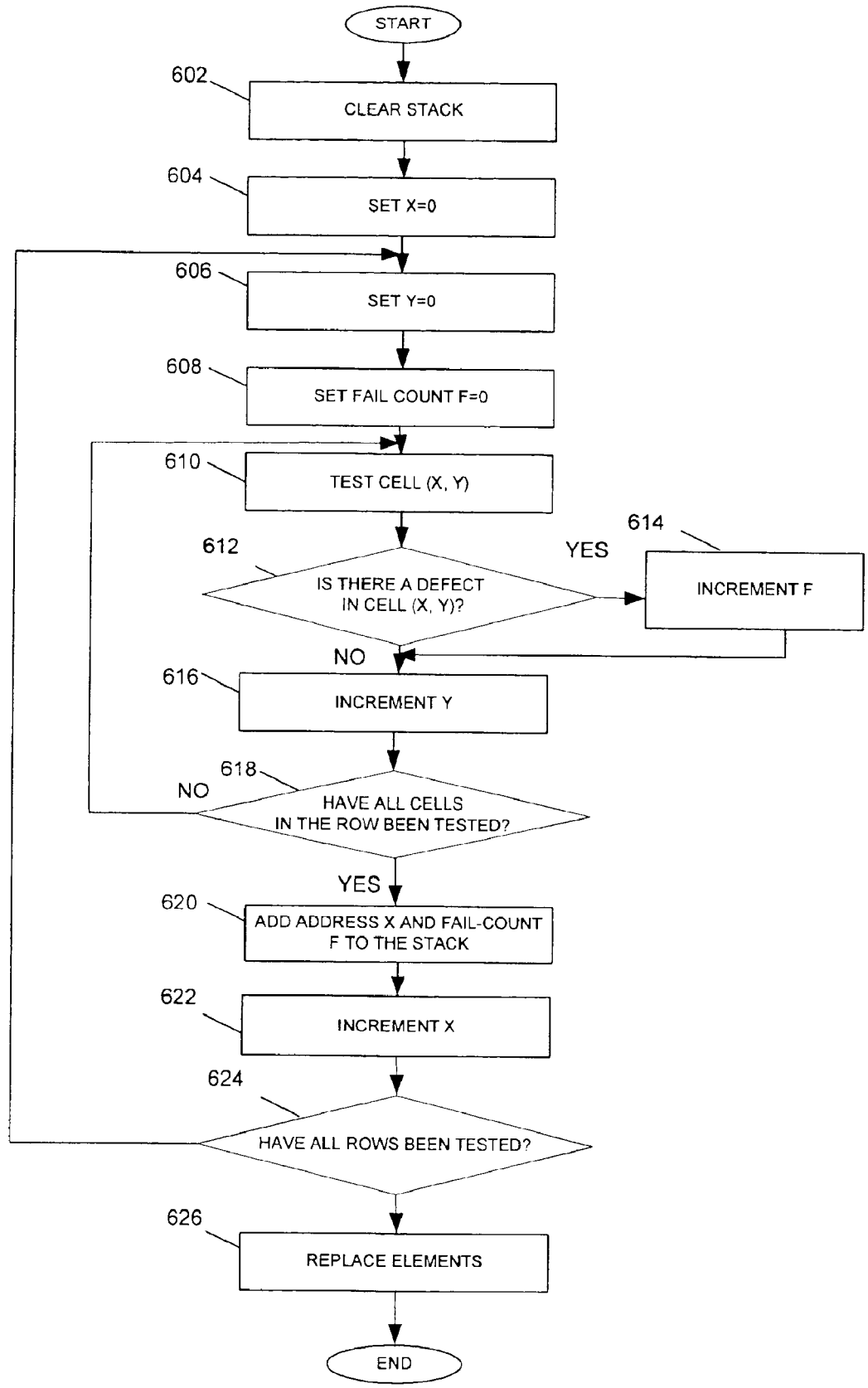
FIG. 6 is a flow chart showing a method of scanning cells of a memory device according to an embodiment of the present invention.

Turning now to FIG. 6, a flow chart shows a method of scanning cells of a memory device according to an embodiment of the present invention. For the following discussion we will assume that X represents the row address and Y the column address. Accordingly, the repair strategy is to find the n wordlines with the highest fail counts. In particular, the register stack is cleared at a step 602. The row-and column-address counters are set to their start values (e.g. X=0, Y=0) at steps 604 and 606, respectively.

According to one aspect of the present invention, all cells along the wordline X are scanned by increment the column address Y. The fail count is reset to zero at the step 608. The cell (X,Y) is tested at a step 610. In case the cell shows a defect at a step 612, the fail-bit counter is incremented at a step 614. This is done for all memory cells on the wordline. After all cells on the first wordline have been tested at a step 618, the fail-count F and the address X are transferred to the fail-address stack at a step 620. The fail address stack accepts a new address and fail-count only if at least one element on the stack has a lower fail count, as will be described in more detail in reference to FIGS. 7 and 8. The row is then incremented at a step 622. This operation is repeated until all wordlines have been tested, as determined at a step 624. Now, the fail address stack contains the addresses of the n wordlines with the highest fail counts. These wordlines are replaced now by activating redundant elements at a step 626.

In order to repair the chip, it is preferable to run the algorithm several times in opposite directions. This means that after scanning the wordlines, one would use the same algorithm to scan the CLSs. This procedure is repeated until no more defect cells are found or all redundancy elements have been used. One advantage of this method is that the redundancy is used very efficiently.

Figure 7:
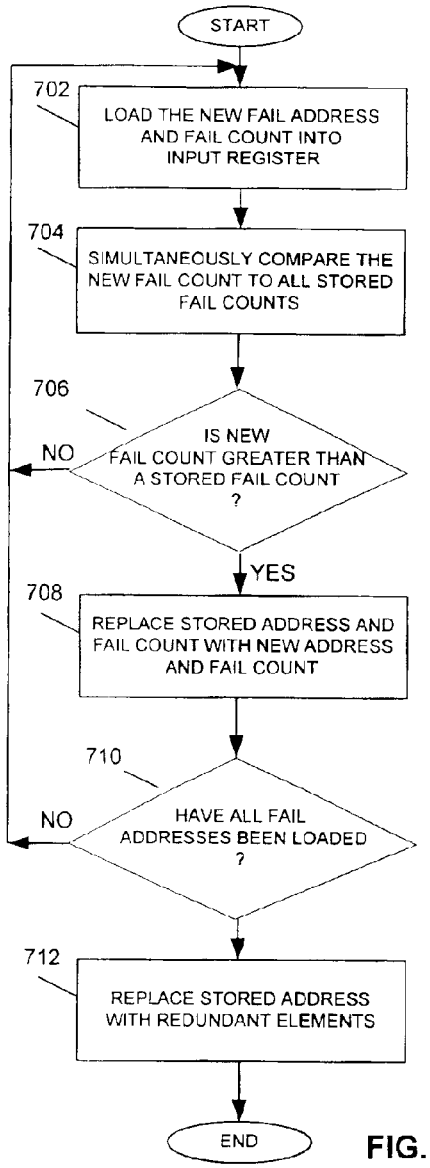
FIG. 7 is a flow chart showing a method of storing fail addresses in a register according to an embodiment of the present invention.

Turning now to FIG. 7, a flow chart shows a method of storing fail addresses in a register according to an embodiment of the present invention. In particular, a new fail address and fail count are loaded into an input register at a step 702. The new fail count is simultaneously compared to all fail counts stored in a stack register at a step 704. It is then determined whether the new fail count is greater than a stored fail count at a step 706. If so, the stored address and corresponding fail count in the register stack is then replaced with the new address and register count from the input register at a step 708. It is then determined if all fail addresses have been loaded in the register stack at a step 710. If not, a new fail address and fail count are loaded into an input register at the step 702. However, determined if all fail addresses have been loaded in the register stack, the rows (or columns) associated with the stored addresses are replaced with redundant elements at a step 712.

Figure 8:
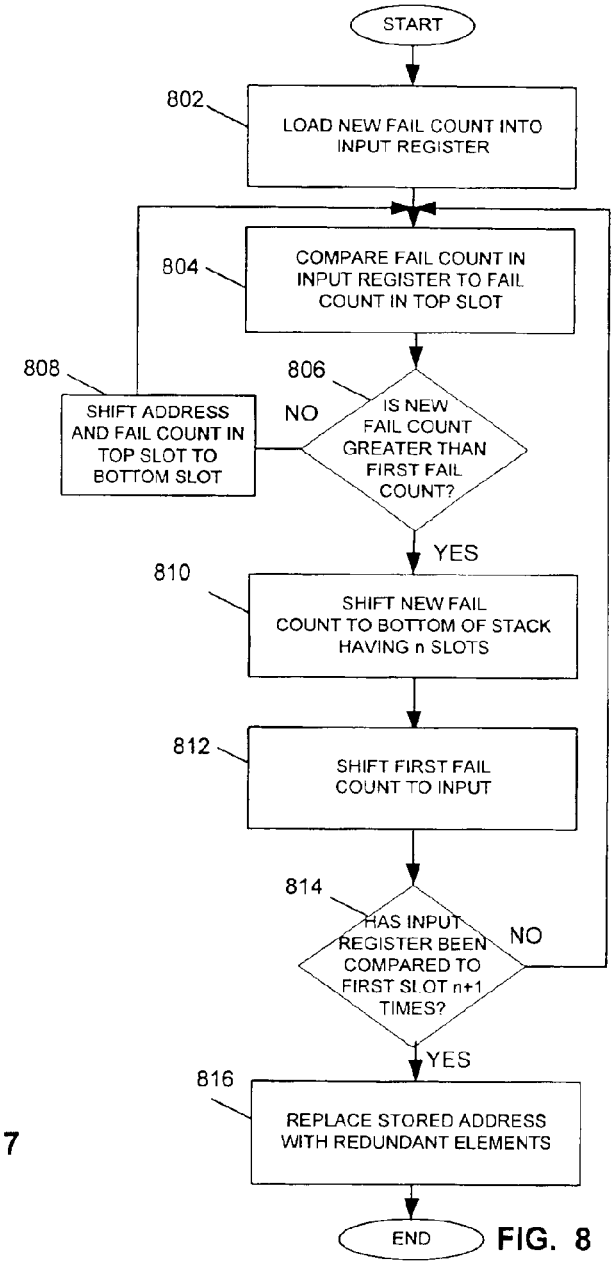
FIG. 8 is a flow chart showing a method of storing fail addresses in a register according to an alternate embodiment of the present invention.

Finally, turning to FIG. 8, a flow chart shows a method of storing fail addresses in a register according to an alternate embodiment of the present invention. In particular, a new fail address and fail count is loaded into an input register at a step 802. The fail count in the input register is compared to the fail count in the top slot of the register stack at a step 804. It is then determined whether the new fail count is greater than the fail count in the top slot at a step 806. If not, the address and the fail count in the top slot is shifted to the bottom slot at a step 808. If so, the new fail count is shifted to the bottom of the stack at a step 810. The fail address and corresponding fail count is then shifted to the input register at a step 812. It is then determined if the input register has been compared to the top slot n+1 times at a step 814. If not, the fail count in the input register is compared to the fail count in top slot of the register stack at the step 804. If so, the rows (or columns) associated with the stored addresses are replaced with redundant elements at a step 816. It should be understood that the reference to top slot and bottom slot are merely given by way of example (as shown for example in FIG. 4).

It can therefore be appreciated that the new and novel memory device and method of storing failure addresses of a memory cell has been described. It will be appreciated by those skilled in the art that, particular the teaching herein, numerous alternatives and equivalents will be seen to exist which incorporate the disclosed invention. As a result, the invention is not to be limited by the foregoing embodiments, but only by the following claims.

What is claimed is:

1. A method of storing failure addresses of a memory cell, said method comprising the steps of:
   storing an address and corresponding fail count for a plurality of cells of said memory cell in a register unit until said register unit is full;
   determining if a plurality of cells in an input register has a greater fail count than a fail count of a plurality of cells currently stored in said register; and
   replacing said address and a corresponding fail count in said register with said address and corresponding fail count in said input register if the fail count of said plurality of cells in said input register is greater than said fail count of said plurality of cells currently stored in said register.

2. The method of claim 1 wherein said step of determining if a plurality of cells in an input register has a greater fail count than a fail count of a plurality of cells currently stored in said register comprises determining if a row in said input register has a greater fail count than a fail count of any row currently stored in said register.

3. The method of claim 2 wherein said step of replacing said address and a corresponding fail count in said register comprises replacing a currently stored row address and a corresponding fail count with a row address and corresponding fail count from said input register.

4. The method of claim 3 further comprising a step of replacing said rows stored in said register with redundant rows.

5. The method of claim 1 wherein said step of determining if a plurality of cells in an input register has a greater fail count than a failure count of a plurality of cells currently stored in said register comprises determining if a column in said input register has a greater fail count than a failure count of any column currently stored in said register.

6. The method of claim 1 wherein said step of replacing said address and a corresponding fail count in said register comprises replacing said currently stored column address and a corresponding fail count with a column address and corresponding fail count in said input register.

7. The method of claim 6 further comprising a step of replacing said columns stored in said register with redundant columns.

8. A method of storing failure addresses of a memory cell, said method comprising the steps of:
   storing a plurality of addresses and corresponding fail counts for a plurality of rows in a register until said register is full;
   loading a new raw address and a corresponding fail count into an input register;
   simultaneously comparing said corresponding fail count of said new row address to said plurality of fail counts stored in said register; and
   replacing a row address and a corresponding fail count in said register if the corresponding fail count of said new address is greater than a fail count corresponding to said row address stored in said register.

9. The method of claim 8 further comprising a step of storing a plurality of addresses and corresponding fail counts for a plurality of columns in a register until said register is full.

10. The method of claim 9 further comprising a step of loading a new column address and a corresponding fail count into an input register.

11. The method of claim 10 further comprising a step of simultaneously comparing said corresponding fail count of said new column address to all stored fail counts.

12. The method of claim 11 further comprising a step of replacing a column address and a corresponding fail count in said register if the corresponding fail count of said new column address is greater than a fail count of a column address stored in said register.

13. The method of claim 12 further comprising steps of repeating said steps of replacing a row address and a corresponding fail count in said register if the corresponding fail count of said new row address is greater than a fail count of a row address stored in said register and replacing a column address and a corresponding fail count in said register if the corresponding fail count of said new column address is greater than a fail count of a column address stored in said register.

14. The method of claim 13 further comprising a step of replacing said column addresses stored in said register with redundant column addresses.

15. A method of storing failure addresses of a memory cell, said method comprising the steps of:
   storing a plurality of row addresses and corresponding failure counts for rows in a register until said register is full;
   loading a new row address and a corresponding fail count into an input register;
   sequentially comparing said corresponding fail count of said new fail address to all stored fail counts in said register; and
   replacing a row address and a corresponding failure count in said register if the corresponding fail count of said new row address is greater than a failure count of said row stored in said register.

16. The method of claim 15 further comprising a step of storing a plurality of addresses and corresponding fail counts for a plurality of columns in a register until said register is full.

17. The method of claim 16 further comprising a step of loading a new column address and a corresponding fail count into an input register.

18. The method of claim 17 further comprising a step of simultaneously comparing said corresponding fail count of said new column address to all stored fail counts.

19. The method of claim 18 further comprising a step of replacing a column address and a corresponding fail count in said register if the corresponding fail count of said new column address is greater than a fail count of a column address stored in said register.

20. The method of claim 19 further comprising steps of repeating said steps of replacing a column address and a corresponding fail count in said register if the corresponding fail count of said new column address is greater than a fail count of a column address stored in said register and replacing a row and a corresponding fail count in said register if the corresponding fail count of said new column address is greater than a fail count of a column stored in said register.

21. The method of claim 20 further comprising a step of replacing said columns stored in said register with redundant columns.

22. A memory device having a built in self test circuit including a register storing failure addresses, said memory device comprising:

an input register receiving an input fail address and an input fail count;

a register having a plurality of slots storing fail addresses and corresponding fail counts; and a plurality of comparators, each said comparator being coupled to the input register to receive from the input register said input fail count and coupled to one of said slots of said register to receive a fail count of the one of said slots of said register, the each said comparator comparing the input fail count of the input register and the fail count of the one of said slots of said register, the input fail count being transferred from the input register when the comparator determines that the input fail count exceeds the fail count.

23. The memory device of claim 22 further comprising a clock signal.

24. The memory device of claim 23 further comprising a switch coupled to said clock signal and the input register, said switch providing said input fail address and said input fail count from the input register to a slot of said register.

25. The memory device of claim 24 wherein said switch closes on a falling edge of said clock signal.

26. The memory device of claim 24 further comprising a plurality of register switches, each register switch of said plurality of register switches being coupled to receive as a switching signal an output of a comparator of said plurality of comparators, each register switch being coupled through said switch to receive the input fail count from the input register when the input switch closes.

27. The memory device of claim 26 wherein each said register switch of said plurality of register switches is coupled to a slot of said plurality of slots of said register to store the input fail count in the slot of said plurality of slots when the switching signal indicates that the comparator determines that the input fail count exceeds the fail count.

28. The memory device of claim 22 wherein said plurality of comparators are coupled to said clock signal, each said comparator being enabled to compare the input fail count of the input register and the fail count of the one of said slots of said register on a rising edge of said clock signal.

29. A memory device having a register storing failure addresses, said memory device comprising:

an input register receiving an input fail address and an input fail count;

a register having a plurality of slots storing fail addresses and corresponding fail counts;

a plurality of comparators, each comparator being coupled to the input register to receive from the input register an input fail count and coupled to one of said slots of said register to receive a fail count of one of said slots of said register, each said comparator comparing the input fail count of the input register and the fail count of the one of said slots of said register and generating a comparator signal in response to the comparison;

a switch coupled to a clock signal and the input register, said switch providing said input fail address and said input fail count from the input register to a slot of said register in response to the clock signal; and a plurality of register switches, each register switch being coupled to a respective comparator to receive the comparator signal at an output of the respective comparator of said plurality of comparators.

* * * * *